US006596981B1

United States Patent
Aswell et al.

(10) Patent No.: US 6,596,981 B1
(45) Date of Patent: Jul. 22, 2003

(54) METHOD AND APPARATUS FOR OPTICAL DETECTOR WITH SPECIAL DISCRIMINATION

(75) Inventors: Cecil Aswell, Orangevale, CA (US); John H. Berlien, Jr., Plano, TX (US); Eugene G. Dierschke, Dallas, TX (US); Lester L. Hodson, McKinney, TX (US)

(73) Assignee: Texas Advanced Optoelectronic Solutions, Inc., Plano, TX (US)

( * ) Notice: Subject to any disclaimer, the term of this patent is extended or adjusted under 35 U.S.C. 154(b) by 0 days.

(21) Appl. No.: 10/047,484

(22) Filed: Jan. 14, 2002

(51) Int. Cl.$^7$ .................................................. H01L 31/00

(52) U.S. Cl. ...................... 250/214.1; 257/435; 257/440

(58) Field of Search ......................... 250/208.1, 214.1; 257/291, 294, 431, 434, 435, 440

(56) References Cited

U.S. PATENT DOCUMENTS

| 5,663,657 A | 9/1997 | Lagowski et al. ........... 324/766 |
| 6,359,323 B1 * | 3/2002 | Eom et al. .................... 257/440 |
| 6,455,908 B1 * | 9/2002 | Johnson et al. .............. 257/440 |

\* cited by examiner

Primary Examiner—Kevin Pyo
(74) Attorney, Agent, or Firm—Haynes and Boone, LLP

(57) ABSTRACT

A monolithic optical detector for determining spectral content of an incident light includes at least a first and second well in a substrate, the second well formed proximate the first well. The first well is configured to be exposed to incident light and for generating a first photocurrent as a function of the incident light. The second well is configured to be shielded from the incident light and for generating a second photocurrent as a function of the incident light. Lastly, a processing and control unit, responsive to the first and second photocurrents, determines an indication of spectral content of the incident light. A method and device parameter controller are also disclosed.

55 Claims, 2 Drawing Sheets

METHOD AND APPARATUS FOR OPTICAL DETECTOR WITH SPECIAL DISCRIMINATION

BACKGROUND

The present invention relates generally to semiconductor devices, and more particularly, to a method and apparatus for an optical detector with spectral discrimination using conventional CMOS components.

Detection of ambient light levels is necessary for purposes such as automatic control of artificial light levels. Silicon photodiodes or phototransistors are frequently employed for this purpose, since they are inexpensive and easy to use. In addition, the silicon photodiodes or phototransistors may be part of an integrated circuit.

However, the response of silicon photo detectors does not match that of the human eye. Depending on the light source and its power spectrum, the difference in brightness as perceived by the human eye and a silicon photo detector can vary greatly. As an example, fluorescent lighting has a spectrum that falls largely within the range of the human eye response, while incandescent lighting emits much of its energy in the infrared (IR) region of the spectrum. A simple silicon photo detector can give a response as much as four (4) times greater for incandescent lighting than for fluorescent lighting for a brightness level which is perceived by the human eye to be the same.

Sunlight has a spectrum between those of fluorescent lighting and incandescent lighting. The ratio of infrared emission to visible emission is highest for incandescent lighting, lowest for fluorescent lighting, and medium for sunlight.

Despite the above discussion, silicon photo detectors can be used for measuring light levels as perceived by the human eye. This can be accomplished by placing an optical filter between the light source and the detector. In doing so, the optical filter enables the composite response to mimic that of the human eye. While this is an effective solution, the filter implies additional expense.

SUMMARY

A monolithic optical detector for determining spectral content of an incident light includes at least a first and second well in a substrate, the second well formed proximate the first well. The first well is configured to be exposed to incident light and for generating a first photocurrent as a function of the incident light. The second well is configured to be shielded from the incident light and for generating a second photocurrent as a function of the incident light. Lastly, a processing and control unit, responsive to the first and second photocurrents, determines an indication of spectral content of the incident light. A method and device parameter controller are also disclosed.

DETAILED DESCRIPTION

Figure 1:
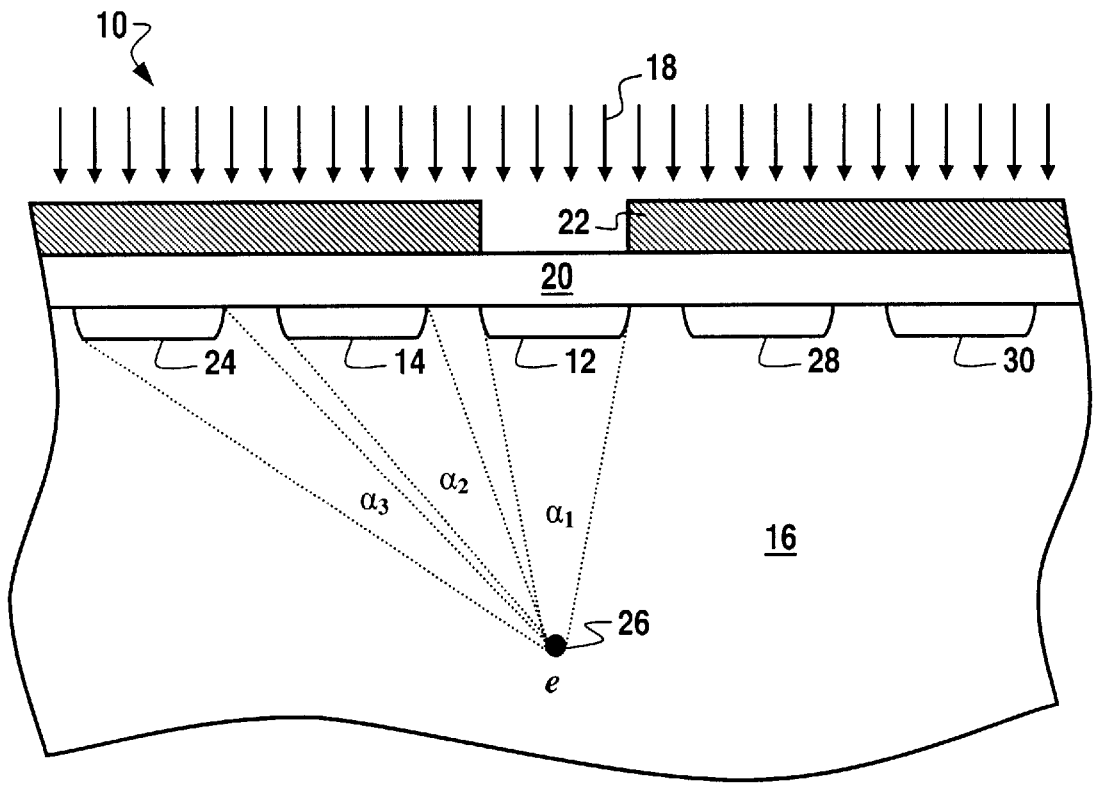
FIG. 1 is a cross-sectional view of an optical detector with spectral discrimination device according to one embodiment of the present disclosure.

With reference to FIG. 1, an optical detector with spectral discrimination according to an embodiment of the present disclosure is referred to, in general, by the reference numeral 10. The detector 10 includes a first well 12 and a second well 14, proximate the first well, the first and second wells being disposed in substrate 16.

According to one embodiment, substrate 16 includes a p-type silicon substrate. First and second wells 12 and 14, respectively, include n-type wells. The first and second wells are of substantially similar dimensions and formed in substrate 16 using standard CMOS integrated circuit fabrication techniques, as known in the art.

First well 12 is configured to be exposed to incident light 18. Second well 14 is configured to be shielded from the incident light 18. Incident light 18 may include, for example, fluorescent light, incandescent light, or sunlight. At least one transparent layer 20 is disposed above at least the first well 12. In addition, at least one layer 22, opaque to incident light 18, is disposed above second well 14. Layer 20 includes any transparent layer, for example, an oxide layer. Layer 22 includes any layer opaque to incident light 18, for example, an opaque conductive layer.

Prior to further discussion of detector 10, let us consider the following. When a photon of incident light is absorbed in silicon, a hole-electron pair is generated. A minority carrier diffuses through the silicon lattice until it either recombines or encounters a diode junction. When the minority carrier encounters a diode junction, it can be collected as photocurrent. The minority carrier is also referred to as a photo carrier.

Photon absorption is a random process, wherein the likelihood of the photon being absorbed in silicon is a function of wavelength. An absorption distance is herein defined as a distance that a quantity 1/e of the incident light travels before being absorbed, wherein e represents the natural logarithm. For the visible wavelengths in the range of 400 to 700 nanometers, the absorption distance is on the order of 3.4 microns or less. At 800 nanometers, the absorption distance is on the order of about 8 microns. At 900 nanometers, the absorption distance is on the order of about 22 microns. At 1000 nanometers, the absorption distance is on the order of about 93 microns.

According to one embodiment of the present disclosure, the optical detector with spectral discrimination method and apparatus makes use of two fundamental facts. The first is that diffusion of minority carriers in a silicon lattice is a random, three-dimensional process. The second is that the absorption distance of light in silicon varies greatly as a function of wavelength.

In standard CMOS integrated circuits, the deepest diode junction is generally a well/substrate junction. For example, the well/substrate junction may include an n-well/p-substrate junction. Such a well/substrate junction is typically on the order of about 4.0 microns deep for a 0.8 micron process. The well/substrate junction depth may differ from 4.0 microns deep for a CMOS process other than the 0.8 micron process.

When such a well/substrate junction diode is used as a photodiode, such as is commonly done in integrated CMOS optoelectronic circuits, most photons of visible wavelengths impinging on the diode are absorbed within the well. The remaining photons are absorbed below the well/substrate junction. Almost all the photo carriers generated within the well or the depletion region surrounding the well junction are collected as photocurrent. A small fraction will be lost to recombination.

The fate of carriers generated below the well/substrate junction of the photodiode, however, depends on their distance from the junction. If the vertical distance below the well is small compared to the lateral dimensions of the diode and the carrier mean diffusion length, then it is highly probable that a photo carrier will be collected by the diode as photocurrent. As the distance below the well increases, a photo carrier is more likely to experience significant lateral, as well as vertical, diffusion.

With sufficient lateral diffusion, a photo carrier can travel far enough away from the photodiode to be collected by any additional diodes adjacent to, or proximate the vicinity of, the photodiode. If other diodes adjacent to the photodiode are shielded from light, then any photo carriers that the shielded diodes collect will be due to photons absorbed below the photodiode junction. Accordingly, it follows that the deeper a photon is absorbed, the more likely it is to be collected by an adjacent diode proximate the vicinity of the photodiode.

If a structure is designed that includes a photodiode exposed to light in close proximity to one or more diodes shielded from light, then the ratio of the photocurrents is indicative of the spectral content of the light. More specifically, the higher the ratio of the dark diode current to the illuminated diode, the greater the long wavelength content.

Returning again to FIG. 1, detector 10 includes an optical detector with spectral discrimination according to an embodiment of the present disclosure. In FIG. 1, diode D1 (12) includes an n-well/p-substrate diode which is exposed to incident light (18). Diodes D2 (14) and D3 (24) are similar diodes which are shielded from the incident light 18. Shielding implies that diodes D2 and D3 are not directly exposed to the incident light.

A carrier, e, indicated in general by reference numeral 26, is generated by a photon being absorbed below the diode D1 junction. To a first approximation, the relative probability that the carrier will be collected by a given diode is proportional to the solid angle subtended by the carrier and the respective diode.

For equally sized diodes, angle $\alpha 1$ will be greater than angle $\alpha 2$, which is in turn greater than angle $\alpha 3$. Expressed another way, $\alpha 1 > \alpha 2$ and $\alpha 2 > \alpha 3$. For carriers generated immediately below diode D1 (i.e., incident light of shorter wavelengths) the ratio of $\alpha 1$ to $\alpha 2$ is quite large. However, as the depth of the carrier increases (i.e., incident light of longer wavelengths), the ratio of $\alpha 1$ to $\alpha 2$ and ratio of $\alpha 2$ to $\alpha 3$ asymptotically approach the value of one (1), as does the ratio of the respective photocurrents.

By measuring the ratio of the photocurrents of diode D1 (12) and diode D2 (14), it is possible to infer wavelength information about a monochromatic light source. The ratio of photocurrents can also be used to estimate the relative spectral content of a broad band light source in order to establish the type of light source. More specifically, according to one embodiment of the present disclosure, this method of spectral discrimination can be used to categorize a light source as fluorescent, incandescent or sunlight.

Additional information regarding spectral content can be inferred from the ratio of diode D3 current to diode D2 and diode D1 currents. Furthermore, the concept of the present embodiments can in theory be extended to any number of diodes.

Figure 2:
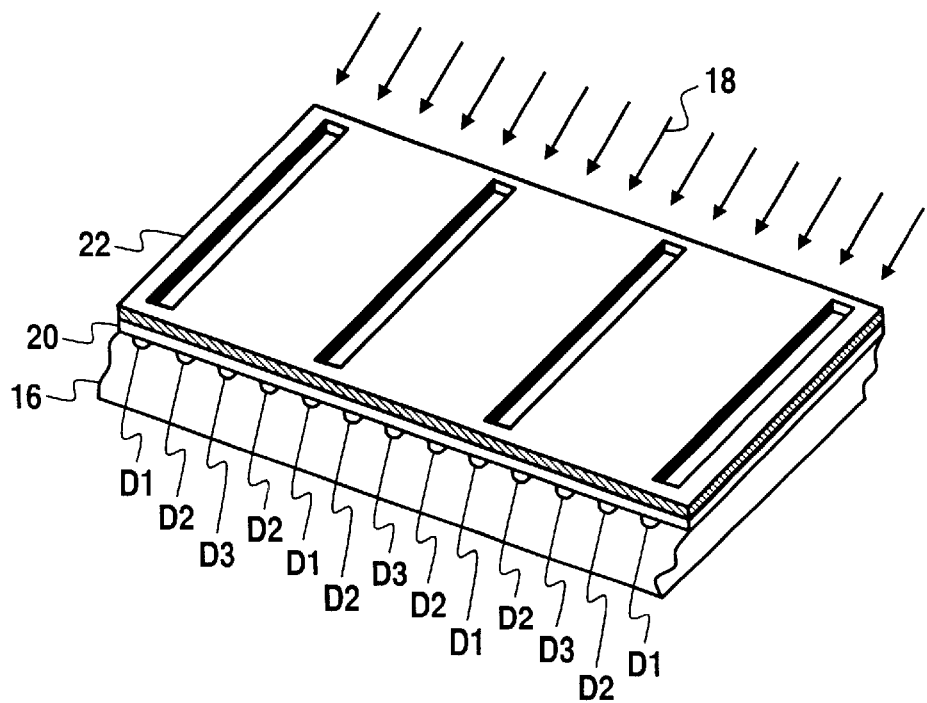
FIG. 2 is a plan view of an optical detector with spectral discrimination according to another embodiment of the present disclosure.

FIG. 1 further illustrates another embodiment of the present disclosure. Diodes D2B (28) and D3B (30) can be made parallel with diodes D2 (14) and D3 (24), respectively, to increase the collection efficiency of the dark diodes. The basic structure of diodes D1 (12), D2 (14), D3 (24), D2B (28) and D3B (30) of FIG. 1 can also be extended to include a repetitive array of light and dark structures, as shown in FIG. 2.

For example, the first well can include a plurality of first wells D1, wherein the plurality of first wells generate a plurality of first photo currents as a function of the incident light. The second well can include a plurality of second wells D2, wherein the plurality of second wells generate a plurality of second photo currents as a function of the incident light. An indication of spectral content of the incident light is determined in response to the plurality of first photo currents and the plurality of second photo currents.

Still further, the plurality of first wells may include an array of first wells and the plurality of second wells further includes an array of second wells proximate respective ones of the array of first wells. The well structures could still further be constructed using concentric geometries.

In alternate embodiments, the first and second wells may further include p-type wells in an n-type substrate, shallow diffusions, deep diffusions, combinations of shallow and deep diffusions, and source/drain diffusions. Still further, the first and second wells may include charge gate MOS diode structures in which a potential applied to the gates of the structures establishes the respective wells.

Figure 3:
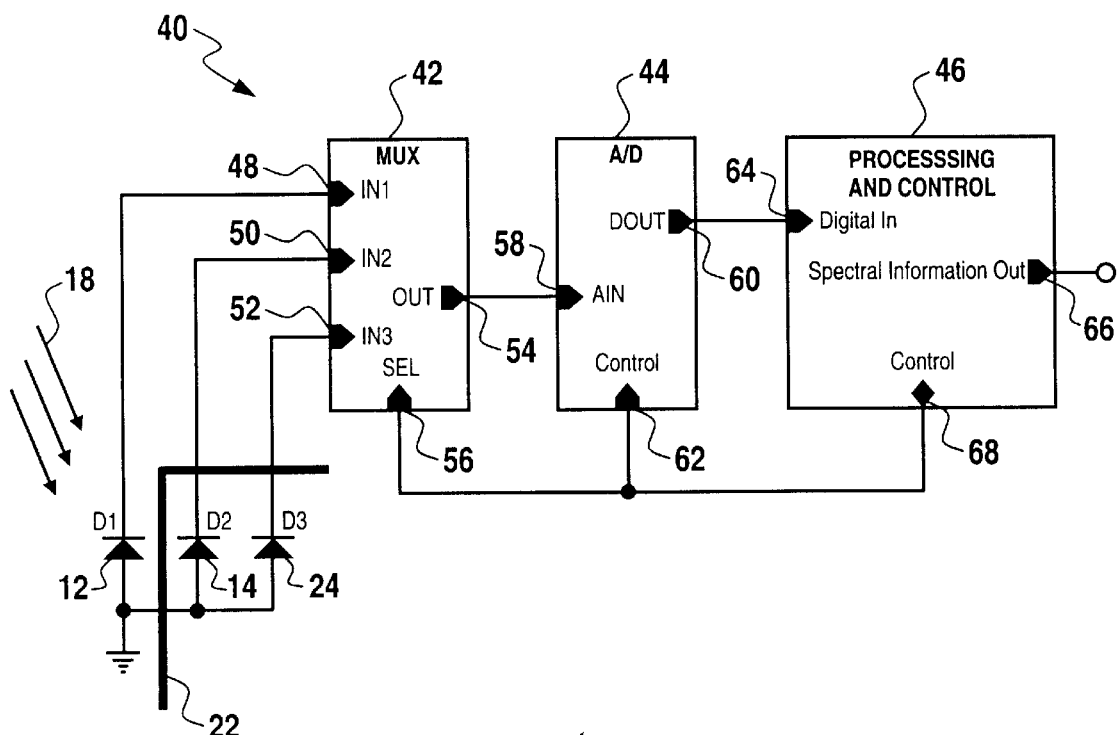
FIG. 3 is a block diagram view of an optical detector with spectral discrimination system according to another embodiment of the present disclosure.

Turning now to FIG. 3, another embodiment of the present disclosure includes an Ambient Light Detector (ALD), generally indicated by reference numeral 40. The ALD includes a multiplexer (MUX) 42, an analog to digital (A/D) converter 44, and processing and control unit (PROCESSING AND CONTROL) 46.

MUX 42 includes inputs IN1, IN2, and IN3 indicated by reference numerals 48, 50 and 52, respectively. MUX 42 also includes an output 54. MUX 42 is responsive to a selection signal on selection input 56 for coupling one of inputs IN1, IN2, and IN3 to output 54.

The output 54 of MUX 42 couples to input 58 of A/D converter 44. A/D converter 44 converts a signal received at input 58 into a digital quantity at output 60, in response to a control signal at control input 62.

The output 60 of A/D converter 44 couples to input 64 of PROCESSING AND CONTROL 46. PROCESSING AND CONTROL 46 provides spectral information on output 66 in response to the digital input at 64. Output 66 provides spectral content information according to the requirements of a particular ambient light detector application. In addition, PROCESSING AND CONTROL 46 provides suitable control signals on control output 68 to select input 56 of MUX 42 and control input 62 of A/D converter 44, further according to the requirements of a particular ambient light detector application.

In FIG. 3, diodes D1 (12), D2 (14) and D3 (24) include the light and dark diodes, as previously described with respect to FIG. 1. Diodes D1 (12), D2 (14) and D3 (24) couple to inputs 48, 50, and 52, respectively of MUX 42. MUX 42 is responsive to a selection signal on a select input for selecting one of the three diodes for input to the A/D converter 44. A/D converter 44 converts a selected one of the output photocurrents of the photodiodes into a representative digital quantity.

In one embodiment, A/D converter 44 integrates a respective one of the input photocurrents over a sufficient time period to average a ripple in the incident light caused by alternating current (AC) lighting. In another embodiment, A/D converter 44 utilizes a logarithmic compression for extending a dynamic range of a photocurrent received at the input of the A/D converter.

In one embodiment, PROCESSING AND CONTROL 46 includes digital circuitry for controlling the MUX 42 and A/D converter 44 according to a desired ambient light detector application. PROCESSING AND CONTROL 46 may also contain circuitry for further conditioning the output 60 of the A/D converter 44 and translating the results of the conditioned A/D output into spectral information. For example, conditioning may include time averaging, amplitude compression, or other conditioning suitable for a particular ambient light detector application.

According to another embodiment, the PROCESSING AND CONTROL unit further contains programmable calibration circuitry, the calibration circuitry configured to account for carrier lifetime differences on different chips. For example, the programmable calibration circuitry can enable calibrating of at least the first and second photocurrents of diodes D1 (12) and D2 (14). In addition, the ambient light detector ALD 40 may include fuses (not shown) associated with the PROCESSING AND CONTROL unit 46 to accomplish the calibration, as may be required. For instance, the fuses could be trimmed during an integrated circuit probe step in the manufacturing process.

According to yet another embodiment, PROCESSING AND CONTROL unit 46 performs a translation of the conditioned A/D converter output that includes, for example, arithmetic processing and use of a table look-up. The translation may be also be accomplished with at least one of hard-wired logic and stored program logic, such as via a microprocessor.

PROCESSING AND CONTROL 46 may also include means, coupled to the output of A/D converter 44 and implemented on the monolithic integrated circuit, for establishing a spectral content response configured to simulate that which would be observed by a human eye.

Figure 4:
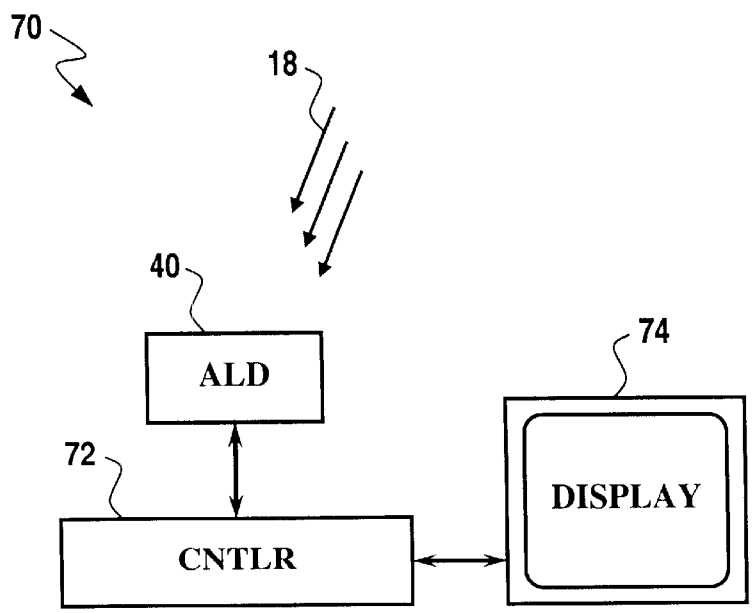
FIG. 4 is a block diagram view of a display controller having an optical detector with spectral discrimination according to another embodiment of the present disclosure.

Referring now to FIG. 4, a block diagram view of a display controller having an optical detector with spectral discrimination according to another embodiment of the present disclosure shall be discussed. The display controller is generally indicated by reference numeral 70. Display controller 70 includes ambient light detector 40 coupled to a controller 72. Controller 72 couples to display 74. Controller 72 may include any suitable control device, circuit, or processor for performing the desired functionality, as discussed herein.

Ambient light detector 40 includes a monolithic optical detector as discussed above with respect to FIG. 3. Ambient light detector 40 provides an indication of the spectral content of the incident light 18 to controller 72. In one embodiment, controller 72 includes a backlight controller, responsive to the indication of spectral content of the incident light 18 for controlling a backlighting of display 74.

Display 74 may include any display responsive to a backlight control signal for producing a desired backlighting with an artificial illumination. An illustrative device may include a display for a laptop computer, for example. Controlling the backlighting of the display screen according to the spectral content of ambient incident light on the laptop computer can facilitate improved power management, extending a useful battery life between recharging periods of the same. Other electronic devices, such as hand held electronic devices, capable of providing backlighting with an artificial illumination, are also contemplated.

Alternatively, controller 72 may include a means for controlling a device parameter in response to the indication of spectral content of the incident light. The device parameter may include any parameter of a device controlled in response to the indication of spectral content of the incident light. The device parameter may include, for example, a backlight control parameter of a display device. The backlight control parameter may include at least a first artificial illumination level for a first type of incident light and a second artificial illumination level for a second type of incident light. The first and second artificial illumination levels can include, for example, backlighting and no backlighting, respectively. The first and second artificial illumination levels may also include additional levels of different artificial illumination.

The device parameter may also include, for example, a color control parameter of a color display. The color control parameter is configured to change the display color characteristics to adapt to environmental light incident upon the display. In this example, controller 72 adjusts the color content of the display in response to the indication of spectral content of the ambient light detected by detector 40.

In another embodiment, controller 72 and PROCESSING AND CONTROL 46 include the same device having functionality as desired for a given optical detection and control application.

Although only a few exemplary embodiments of this invention have been described in detail above, those skilled in the art will readily appreciate that many modifications are possible in the exemplary embodiments without materially departing from the novel teachings and advantages of this invention. For example, the functionality of the various embodiments as discussed herein can be provided on a single monolithic integrated circuit. Accordingly, all such modifications are intended to be included within the scope of this invention as defined in the following claims. In the claims, means-plus-function clauses are intended to cover the structures described herein as performing the recited function and not only structural equivalents, but also equivalent structures.

What is claimed is:

1. A monolithic optical detector comprising:
   a first well in a substrate, said first well configured to be exposed to incident light and for generating a first photocurrent as a function of the incident light;
   a second well in the substrate, proximate said first well, said second well configured to be shielded from the incident light and for generating a second photocurrent as a function of the incident light; and
   means, responsive to the first and second photocurrents, for determining an indication of spectral content of the incident light.

2. The detector of claim 1, wherein said means for determining the indication of spectral content includes determining a ratio of the first and second photocurrents, wherein the ratio provides a measure of spectral content.

3. The detector of claim 2, wherein the ratio further includes at least one of a first measurement range representative of a first type of incident light, a second measurement range representative of a second type of incident light, and a third measurement range representative of a third type of incident light.

4. The detector of claim 3, wherein the first, second, and third type of incident light include at least one of fluorescent light, incandescent light, and sun light.

5. The detector of claim 1, wherein said first and second wells include at least one of n-type wells in a p-type substrate, p-type wells in an n-type substrate, shallow diffusions, deep diffusions, combinations of shallow and deep diffusions, source/drain diffusions, and charge gate MOS diode structures.

6. The detector of claim 1, further wherein said first and second wells include wells of substantially similar dimensions.

7. The detector of claim 1, wherein the indication of spectral content includes a wavelength.

8. The detector of claim 1, further comprising:
    means for calibrating at least one of the first and second photocurrents.

9. The detector of claim 1, further comprising:
    at least one transparent dielectric layer disposed above at least said first well; and
    at least one opaque layer disposed above said second well.

10. The detector of claim 9, wherein the at least one opaque layer includes a conductive layer.

11. The detector of claim 1, further comprising:
    at least one additional well in the substrate, proximate said first and second wells, said at least one additional well configured to be shielded from the incident light and for generating at least one additional photocurrent as a function of the incident light, respectively; and wherein said means for determining the indication of spectral content includes means, responsive further to the at least one additional photocurrent, for determining the indication of spectral content of the incident light.

12. The detector of claim 11, wherein said means for determining the indication of spectral content includes determining a ratio of the first and second photocurrents, the ratio providing a measure of spectral content, further including determining at least one additional ratio of the second and at least one additional photocurrents, wherein the at least one additional ratio provides an additional measure of spectral content of the incident light.

13. The detector of claim 12, wherein the ratio and at least one additional ratio further include at least one of a first measurement range representative of a first type of incident light, a second measurement range representative of a second type of incident light, and a third measurement range representative of a third type of incident light, respectively.

14. The detector of claim 13, wherein the first, second, and third type of incident light include at least one of fluorescent light, incandescent light, and sun light.

15. The detector of claim 11, further wherein said first, second, and at least one additional wells include wells of substantially similar dimensions.

16. The detector of claim 1, further comprising:
    at least one analog-to-digital (A/D) converter integrated with said first and second wells and formed as a monolithic integrated circuit, said first and second wells being coupled to at least one input of said at least one A/D converter for converting a respective one of the first and second photocurrent into a digital output.

17. The detector of claim 16, wherein further comprising:
    a multiplexer coupled between said first and second wells and an input of said A/D converter, said multiplexer for selectively coupling the first and second photocurrents to the input of said A/D converter.

18. The detector of claim 16, wherein said at least one A/D converter integrates a respective one of the first and second photocurrents over a sufficient time period to average a ripple in the incident light caused by alternating current (AC) lighting.

19. The detector of claim 16, further comprising:
    means, coupled to an output of said at least one A/D converter and implemented on the monolithic integrated circuit, for establishing a spectral content response configured to simulate that which would be observed by a human eye.

20. The detector of claim 16, wherein said at least one A/D converter utilizes a logarithmic compression for extending a dynamic range of a photocurrent received at the at least one input of said at least one A/D converter.

21. The detector of claim 1, further comprising:
    means, coupled to said determining means, for controlling a device parameter in response to the indication of spectral content of the incident light.

22. The detector of claim 21, wherein the device parameter includes at least one of a backlight control parameter of a display and a color control parameter of a color display.

23. The detector of claim 22, wherein the backlight control parameter includes at least a first artificial illumination level for a first type of incident light and a second artificial illumination level for a second type of incident light.

24. The detector of claim 1, wherein said first well includes a plurality of first wells, the plurality of first wells for generating a plurality of first photo currents as a function of the incident light,
    wherein said second well includes a plurality of second wells, the plurality of second wells for generating a plurality of second photo currents as a function of the incident light, and
    wherein said determining means determines an indication of spectral content of the incident light in response to the plurality of first photo currents and the plurality of second photo currents.

25. The detector of claim 24, wherein the plurality of first wells further includes an array of first wells and the plurality of second wells further includes an array of second wells proximate respective ones of the array of first wells.

26. The detector of claim 25, still further wherein the array of first wells and the array of second wells include repetitive arrays.

27. The detector of claim 25, wherein the arrays of first and second wells form a concentric geometry of first and second wells.

28. A method for determining spectral content of incident light upon a monolithic optical detector comprising:
    generating a first photocurrent as a function of the incident light at a first well in a substrate, the first well configured to be exposed to incident light;
    generating a second photocurrent as a function of the incident light at a second well in the substrate proximate the first well, the second well configured to be shielded from the incident light; and
    determining an indication of spectral content of the incident light in response to the first and second photocurrents.

29. The method of claim 28, wherein determining the indication of spectral content includes determining a ratio of the first and second photocurrents, wherein the ratio provides a measure of spectral content.

30. The method of claim 29, wherein the ratio further includes at least one of a first measurement range representative of a first type of incident light, a second measurement range representative of a second type of incident light, and a third measurement range representative of a third type of incident light.

31. The method of claim 30, wherein the first, second, and third type of incident light include at least one of fluorescent light, incandescent light, and sun light.

32. The method of claim 28, wherein the first and second wells include at least one of n-type wells in a p-type substrate, p-type wells in an n-type substrate, shallow diffusions, deep diffusions, combinations of shallow and deep diffusions, source/drain diffusions, and charge gate MOS diode structures.

33. The method of claim 28, further wherein the first and second wells include wells of substantially similar dimensions.

34. The method of claim 28, wherein the indication of spectral content includes a wavelength.

35. The method of claim 28, further comprising calibrating at least one of the first and second photocurrents.

36. The method of claim 28, further comprising:
disposing at least one transparent dielectric layer above at least the first well; and
disposing at least one opaque layer above the second well.

37. The method of claim 36, wherein the at least one opaque layer includes a conductive layer.

38. The method of claim 28, further comprising:
generating at least one additional photocurrent as a function of the incident light at an at least one additional well in the substrate, proximate the first and second wells, the at least one additional well configured to be shielded from the incident light, respectively; and
wherein determining the indication of spectral content includes determining the indication of spectral content of the incident light, further in response to the at least one additional photocurrent.

39. The method of claim 38, wherein determining the indication of spectral content includes determining a ratio of the first and second photocurrents, the ratio providing a measure of spectral content, further including determining at least one additional ratio of the second and at least one additional photocurrents, wherein the at least one additional ratio provides an additional measure of spectral content of the incident light.

40. The method of claim 39, wherein the ratio and at least one additional ratio further include at least one of a first measurement range representative of a first type of incident light, a second measurement range representative of a second type of incident light, and a third measurement range representative of a third type of incident light, respectively.

41. The method of claim 40, wherein the first, second, and third type of incident light include at least one of fluorescent light, incandescent light, and sun light.

42. The method of claim 38, further wherein said first, second, and at least one additional wells include wells of substantially similar dimensions.

43. The method of claim 28, further comprising:
providing at least one analog-to-digital (A/D) converter with the first and second wells to form a monolithic integrated circuit, the first and second wells being coupled to at least one input of the at least one A/D converter for converting a respective one of the first and second photocurrent into a digital output.

44. The method of claim 43, further comprising:
selectively multiplexing the first and second photocurrents of the first and second wells, respectively, to an input of the A/D converter.

45. The method of claim 43, wherein the at least one A/D converter integrates a respective one of the first and second photocurrents over a sufficient time period to average a ripple in the incident light caused by alternating current (AC) lighting.

46. The method of claim 43, further comprising:
establishing a spectral content response based on an output of the at least one A/D converter, the spectral content response configured to simulate that which would be observed by a human eye.

47. The method of claim 43, wherein the at least one A/D converter utilizes a logarithmic compression for extending a dynamic range of a photocurrent received at the at least one input of said at least one A/D converter.

48. The method of claim 28, further comprising:
controlling a device parameter in response to the indication of spectral content of the incident light.

49. The method of claim 48, wherein the device parameter includes at least one of a backlight control parameter of a display and a color control parameter of a color display.

50. The method of claim 49, wherein the backlight control parameter includes at least a first artificial illumination level for a first type of incident light and a second artificial illumination level for a second type of incident light.

51. The method of claim 28, wherein the first well includes a plurality of first wells, the plurality of first wells for generating a plurality of first photo currents as a function of the incident light,
wherein the second well includes a plurality of second wells, the plurality of second wells for generating a plurality of second photo currents as a function of the incident light, and
wherein the indication of spectral content of the incident light is determined in response to the plurality of first photo currents and the plurality of second photo currents.

52. The detector of claim 51, wherein the plurality of first wells further includes an array of first wells and the plurality of second wells further includes an array of second wells proximate respective ones of the array of first wells.

53. The detector of claim 52, still further wherein the array of first wells and the array of second wells include repetitive arrays.

54. The detector of claim 52, wherein the arrays of first and second wells form a concentric geometry of first and second wells.

55. A display controller comprising:
a monolithic optical detector including first and second wells in a substrate, the second well proximate the first well, the first well configured to be exposed to incident light and for generating a first photocurrent as a function of the incident light, the second well configured to be shielded from the incident light and for generating a second photocurrent as a function of the incident light, said monolithic optical detector further including means, responsive to the first and second photocurrents, for determining an indication of spectral content of the incident light; and
a backlight controller responsive to the indication of spectral content of the incident light for controlling a backlighting of a display.

* * * * *